(12) United States Patent
Polishchuk et al.

(10) Patent No.: US 8,691,648 B1
(45) Date of Patent: Apr. 8, 2014

(54) METHODS FOR FABRICATING SEMICONDUCTOR MEMORY WITH PROCESS INDUCED STRAIN

(75) Inventors: Igor Polishchuk, Fremont, CA (US); Sagy Levy, Zichron Ya'aqov (IL); Krishnaswamy Ramkumar, San Jose, CA (US); Jeong Soo Byun, Cupertino, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 258 days.

(21) Appl. No.: 13/168,711

(22) Filed: Jun. 24, 2011

Related U.S. Application Data

(62) Division of application No. 12/152,521, filed on May 13, 2008, now abandoned.

(60) Provisional application No. 60/940,156, filed on May 25, 2007.

(51) Int. Cl.
*H01L 21/336* (2006.01)
(52) U.S. Cl.
USPC ................. 438/257; 257/314; 257/E21.21
(58) Field of Classification Search
USPC .......... 438/424, 431, 211, 257; 257/499, 647, 257/314, 316, E21.21, E21.679
See application file for complete search history.

(56) References Cited

U.S. PATENT DOCUMENTS

| | | | |
|---|---|---|---|
| 6,908,822 B2 | 6/2005 | Rendon et al. | |
| 6,992,025 B2 | 1/2006 | Maa et al. | |
| 7,026,235 B1 | 4/2006 | Ben-Tzur et al. | |
| 7,033,869 B1 | 4/2006 | Xiang et al. | |
| 7,521,314 B2 | 4/2009 | Jawarani et al. | |
| 7,659,213 B2 * | 2/2010 | Wei et al. | 438/766 |
| 7,678,662 B2 * | 3/2010 | Arghavani et al. | 438/424 |

OTHER PUBLICATIONS

USPTO Advisory Action for U.S. Appl. No. 12/152,521 dated May 2, 2011; 2 pages.
USPTO Final Rejection for U.S. Appl. No. 12/152,521 dated Feb. 24, 2011; 9 pages.
USPTO Non-Final Rejection for U.S. Appl. No. 12/152,521 dated Sep. 28, 2010; 7 pages.
USPTO Notice of Allowance for U.S. Appl. No. 13/539,463 dated Aug. 19, 2013; 6 pages.
International Search Report for International Application No. PCT/US13/54874 dated Oct. 29, 2013; 2 pages.
Written Opinion of the International Searching Authority for International Application No. PCT/US13/54874 mailed Oct. 29, 2013; 3 pages.
U.S. Appl. No. 13/539,463: "Methods for Fabricating Semiconductor Memory With Process Induced Strain" Igor Polishchuk et al., filed on Jul. 1, 2012; 55 pages.

* cited by examiner

*Primary Examiner* — Quoc Hoang

(57) ABSTRACT

Non-volatile semiconductor memories and methods of fabricating the same to improve performance thereof are provided. In one embodiment, the method includes: (i) forming a gate for a non-volatile memory transistor on a surface of a substrate overlaying a channel region formed therein, the gate including a charge trapping layer; and (ii) forming a strain inducing structure over the gate of the non-volatile memory transistor to increase charge retention of the charge trapping layer. Preferably, the memory transistor is a silicon-oxide-nitride-oxide-silicon (SONOS) transistor comprising a SONOS gate stack. More preferably, the memory also includes a logic transistor on the substrate, and the step of forming a strain inducing structure comprises the step of forming the strain inducing structure over the logic transistor. Other embodiments are also disclosed.

20 Claims, 4 Drawing Sheets

METHODS FOR FABRICATING SEMICONDUCTOR MEMORY WITH PROCESS INDUCED STRAIN

CROSS-REFERENCE TO RELATED APPLICATIONS

The present application is a divisional application of U.S. patent application Ser. No. 12/152,521, filed May 13, 2008, which claims the benefit of priority under 35 U.S.C. 119(e) to U.S. Provisional Patent Application Ser. No. 60/940,156 entitled "SONOS Memory Enhanced by Process Induced Strain," filed May 25, 2007, which application is hereby incorporated by reference in its entirety.

TECHNICAL FIELD

The present invention relates generally to semiconductor devices, and more particularly to non-volatile semiconductor memories and methods of fabricating the same.

BACKGROUND OF THE INVENTION

Non-volatile semiconductor memories are devices that can be electrically erased and reprogrammed. One type of non-volatile memory that is widely used for general storage and transfer of data in and between computers and other electronic devices is flash memory, such as a split gate flash memory. A split gate flash memory transistor has an architecture similar to that of a conventional logic transistor, such as Metal-Oxide-Semiconductor Field Effect Transistor (MOSFET), in that it also includes a control gate formed over a channel connecting a source and drain in a substrate. However, the memory transistor further includes a charge trapping layer between the control gate and the channel and insulated from both by insulating or dielectric layers. A programming voltage applied to the control gate traps a charge on the charge trapping layer, partially canceling or screening an electric field from the control gate, thereby changing a threshold voltage ($V_T$) of the transistor and programming the memory cell. During read-out, this shift in $V_T$ is sensed by the presence or absence of current flow through the channel with application of a predetermined read-out voltage. To erase the memory transistor, an erase voltage is applied to the control gate to restore, or reverse the shift in $V_T$.

An important measure of merit for flash memories is data retention time, which is the time for which the memory transistor can hold charge or remain programmed without the application of power. The charge stored or trapped in the charge trapping layer decreases over time due to leakage current through the insulating layers, thereby reducing the difference between a programmed threshold voltage (VTP) and an erased threshold voltage (VTE) limiting data retention of the memory transistor. Up until this time, efforts to improve data retention have focused on engineering of band-gaps of materials of the charge storage and insulating layers to increase charge trapping and/or reduce leakage current. However there are several fundamental problems with this approach.

One problem is that as semiconductor memories and their associated memory transistors continue to scale to smaller geometries it becomes increasingly difficult to control composition and thickness of the charge storage and insulating layers to achieve desired data retention time.

Another problem is that increasingly semiconductor memories combine logic transistors, such as MOSFET's, with memory transistors in integrated circuits (ICs) fabricated on a common substrate for embedded memory or System-On-Chip (SOC) applications. Many of the current processes for improving performance of memory transistors through band-gap engineering are incompatible with those used for fabricating logic transistors.

Finally, the current band-gap engineering processes do nothing to improve the speed or efficiency, measured as a function of the programming voltage or power applied to the control gate, with which the memory transistors are programmed.

Accordingly, there is a need for memory transistors and methods of forming the same that provides improved data retention, and increased programming speed and efficiency. It is further desirable that the methods of forming the memory device are compatible with those for forming logic elements in the same IC formed on a common substrate.

SUMMARY OF THE INVENTION

The present invention provides a solution to these and other problems, and offers further advantages over conventional memory cells or devices and methods of forming the same.

In a first aspect, the present invention is directed to a method of forming a semiconductor memory including a non-volatile memory transistor. Generally, the method comprises steps of: (i) forming a gate for the non-volatile memory transistor on a surface of a substrate overlaying a channel region formed therein, the gate including a charge trapping layer; and (ii) forming a strain inducing structure over the gate of the non-volatile memory transistor to increase charge retention of the charge trapping layer. Preferably, the step of forming a strain inducing structure comprises the step of forming the strain inducing structure over at least a portion of the surface of the substrate surrounding the channel region to induce strain in the channel region underlying the gate. More preferably, the semiconductor memory further includes a logic transistor formed on the same substrate prior to forming the strain inducing structure, and the step of forming a strain inducing structure further comprises the step of forming the strain inducing structure surrounding the logic transistor to induce strain in a channel region thereof.

In certain embodiments, the non-volatile memory transistor is a silicon-oxide-nitride-oxide-silicon (SONOS) transistor comprising a SONOS gate stack.

The strain inducing structure can include a pre-metal dielectric (PMD) layer formed using a High Aspect Ratio Process (HARP™) oxidation process, a compressive or tensile nitride layer formed using a plasma enhanced chemical vapor deposition (PECVD) or a Bis-TertiaryButylAmino Silane (BTBAS) nitride layer.

In another embodiment, the method further comprises forming spacers including a disposable spacer material on sidewalls of the gate for the non-volatile memory transistor prior to forming the strain inducing structure. Each of the spacers comprise a first liner having a stepped portion with disposable spacer material formed over the stepped portion. Source and drain regions are then by ion implantation through a portion of the first liner over the source/drain region, and the disposable spacer material removed after forming the source/drain region.

In still other embodiments, the method comprises steps of forming a strain inducing structure on at least a portion of a surface of a substrate proximal to a region of the substrate in which a channel of the non-volatile memory transistor is to be formed prior to forming the transistor. Preferably, the step of forming a strain inducing structure comprises the steps of: (i) forming a number of isolation trenches in the surface of the substrate proximal to the region in which the channel of the non-volatile memory transistor is to be formed; and (ii) depositing an isolation oxide having intrinsic tensile stress in the number of isolation trenches. More preferably, the step of depositing an isolation oxide comprises the step of depositing an oxide using a High Aspect Ratio Process (HARP™) oxidation process. As in the preceding embodiment of the method, the semiconductor memory can further include a logic transistor, and the step of forming a strain inducing structure can include forming the structure proximal to the logic transistor to induce strain in a channel region of the logic transistor.

In another aspect, the present invention is directed to a semiconductor memory or integrated circuit (IC) including a memory transistor formed on a surface of a substrate. Preferably, the memory transistor is a silicon-oxide-nitride-oxide-silicon (SONOS) transistor with a SONOS gate stack overlaying a channel region formed in the substrate, and the memory or IC further includes a strain inducing structure formed on the surface of the substrate proximal to the non-volatile memory transistor. More preferably, the memory or IC further includes a logic transistor, and the strain inducing structure is also formed proximal to the logic transistor to induce strain in a channel region thereof. As noted above, the strain inducing structure can comprise a number of isolation trenches filled with an isolation oxide having a high intrinsic tensile stress. Alternatively or additionally, the strain inducing structure can comprise an overlying a PMD layer formed using a HARP™ oxidation process, a compressive or tensile PECVD nitride layer or a BTBAS nitride layer.

BRIEF DESCRIPTION OF THE DRAWINGS

These and various other features and advantages of the present invention will be apparent upon reading of the following detailed description in conjunction with the accompanying drawings and the appended claims provided below, where:

DETAILED DESCRIPTION

The present invention is directed generally to non-volatile semiconductor memories including a silicon-oxide-nitride-oxide-silicon (SONOS) memory transistor or cell and incorporating a strain inducing structure to increase data retention and/or to improve programming time and efficiency. The structure and method are particularly useful for embedded memory or System-On-Chip (SOC) applications in which a semiconductor memory includes both memory and logic transistors in an integrated circuit (IC) formed on a common substrate.

In the following description, for purposes of explanation, numerous specific details are set forth in order to provide a thorough understanding of the present invention. It will be evident, however, to one skilled in the art that the present invention may be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The term "to couple" as used herein may include both to directly connect and to indirectly connect through one or more intervening components.

In a first embodiment the method includes steps of forming a strain inducing structure in or on a surface of a substrate proximal to, and preferably surrounding, a region of the substrate in which a channel of a non-volatile memory transistor is to be formed prior to forming the transistor. Inducing strain in the channel of the memory transistor will reduce the band gap, and, depending on the type of strain, increases carrier mobility. For example, tensile strain, in which inter-atomic distances in the crystal lattice of the substrate are stretched, increases the mobility of electrons, making N-type transistors faster. Compressive strain, in which those distances are shortened, produces a similar effect in P-type transistors by increasing the mobility of holes. Both of these strain induced factors, i.e., reduced band gap and increased carrier mobility, will result in more efficient generation of hot carriers, which in turn, results in faster and more efficient programming of the memory transistor.

Figure 1:
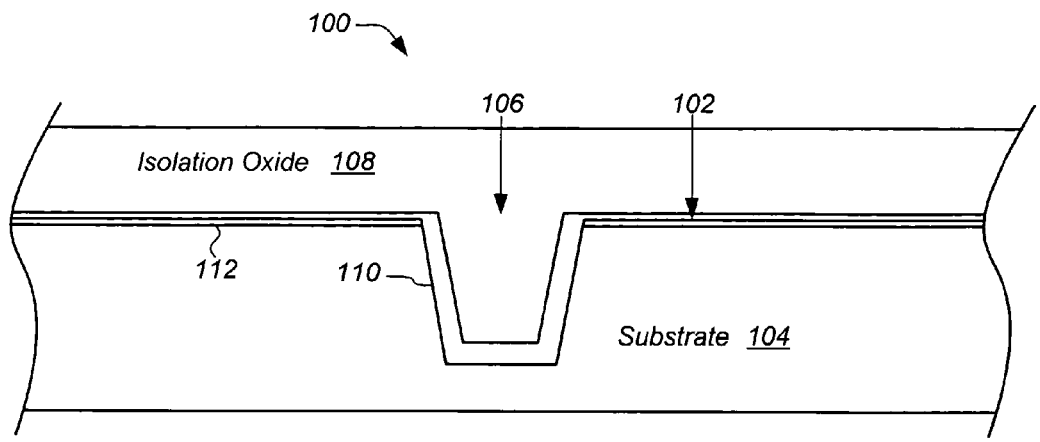
FIG. 1 is a block diagram illustrating a cross-sectional side view of a portion of a substrate of a semiconductor memory including a strain inducing isolation structure according to an embodiment of the present invention.

In one version of this embodiment the strain inducing structure includes one or more shallow trench isolation (STI) structures filled with a dielectric material, such as an isolation oxide, having a high intrinsic tensile stress, and disposed about or encompassing the region in which the memory transistor is to be formed. FIG. 1 depicts a partial cross-sectional view of a strain inducing STI structure 100 formed in a surface 102 of a semiconductor wafer or substrate 104 near to a region or regions in which memory transistor(s) (not shown in this figure) will be formed. The STI structure 100 includes one or more relatively deep STI trenches 106 etched or formed in the substrate 104, and filled with an isolation oxide 108 having a high intrinsic tensile stress. The STI structure 100 further includes a liner oxide 110 formed on the surface 102 of the substrate 104 and on interior surfaces of the STI trench 106 prior to filling with the isolation oxide 108. Generally, as shown, there is a pad oxide 112 on the surface 102 of the substrate 104 prior to forming the STI trenches 106.

The substrate 104 may include any known semiconductor material, such as Silicon, Gallium-arsenide, Germanium, Gallium-nitride, Aluminum-phosphide, and mixtures or alloys thereof. Preferably, the substrate 104 is a doped or undoped silicon-based semiconductor substrate, such as a monocrystalline silicon, silicon-germanium, silicon-on-insulator, or silicon-on-sapphire substrate.

The liner oxide 110 can include a thin layer or film of a thermally grown silicon-dioxide (SiO$_2$) having a thickness of from about 10 to about 200 angstroms (Å), and more preferably at least about 125 Å.

The STI trench 106 generally has a depth of from about 2000 to about 4000 Å, and a width or cross-section of from about 40 to about 250 nm.

Referring to FIG. 1, the method of forming the strain inducing STI structure 100 begins with forming a patterned mask layer over the surface 102 of the substrate 104 and etching a number of STI trenches 106 into the substrate 102. Preferably, the number of STI trenches 106 includes trenches etched on each side of the region in which the memory transistor is to be formed, or a single STI trench substantially encompassing the region to induce biaxial or uniaxial strain in the region. The patterned mask layer (not shown) can be formed, for example, by depositing and patterning a plasma enhanced chemical vapor deposition (PECVD) nitride layer using standard photolithographic techniques and nitride etch technologies. The STI trench etch can be accomplished using any suitable dry etching chemistry for etching a semiconductor or silicon substrate. Suitable STI trench etch chemistries can include, for example, one or more of the following etchant or process gases trichloroborane (BCl$_3$), Chlorine (Cl$_2$), oxygen (O$_2$) and hydrogen-bromide (HBr). In addition, the etch chemistry may further include an inert gas, such as argon (Ar), nitrogen (N$_2$), or xenon (Xe).

The STI etch is followed by the forming of the liner oxide 110 on surfaces of the substrate 104 exposed by the STI trench 106. The liner oxide 110 can be formed in a number of ways including, for example, thermally growing the oxide in the same or a separate process chamber of a process tool, such as a thermal reactor or furnace.

Next, the patterned mask layer is removed and the STI trenches 106 filled with an isolation oxide 108 having a high intrinsic tensile stress to yield the intermediate structure shown in FIG. 1. Excess isolation oxide 108 can be removed using, for example, a chemical mechanical polishing or planarizing (CMP) process. Preferably, substantially all of the isolation oxide 108 on top of the surface 102 of the substrate 104 is removed.

Generally, the isolation oxide 108 can be deposited or grown using any suitable process and material having or providing a high intrinsic tensile stress. Preferably, the isolation oxide 108 is a tensile High Aspect Ratio Process (HARP™) oxide commercially available from Applied Materials, Inc. of Santa Clara, Calif., and deposited using a HARP™ oxidation process. The HARP™ oxide can be deposited, for example, in a low pressure chemical vapor deposition (LPCVD) tool using ozone (O$_3$) and/or tetraethylorthosilicate (TEOS) based process gas or precursors.

Unlike the band-gap engineering approaches used previously to improve memory transistor performance, the methods of forming the strain inducing structures of the present invention are compatible with standard semiconductor fabrication processes used to form logic elements or transistors, such as Metal-Oxide-Semiconductor Field Effect Transistors (MOSFETs). Thus, advantageously the semiconductor memory further includes a number of logic transistors (not shown) formed on the same substrate, and the STI structure further comprises a number of trenches filled with high intrinsic tensile stress isolation oxide proximal to, and preferably surrounding, the region in which the logic transistors are to be formed to induce strain in a channel of the logic transistor to improve logic transistor performance through reduced band gap and increased carrier mobility.

In other embodiments, the strain inducing structure can alternatively or additionally comprise an overlying strain inducing layer or structure formed over the completed transistors. Several of these embodiments will now be described in greater detail with reference to FIGS. 2A through 2E, which schematically illustrate cross-sectional side views of a non-volatile memory transistor and the overlying strain inducing structure according to various embodiments of the present invention. For purposes of clarity, many of the details of semiconductor fabrication that are widely known and are not relevant to the present invention have been omitted from the following description.

Figure 2A:
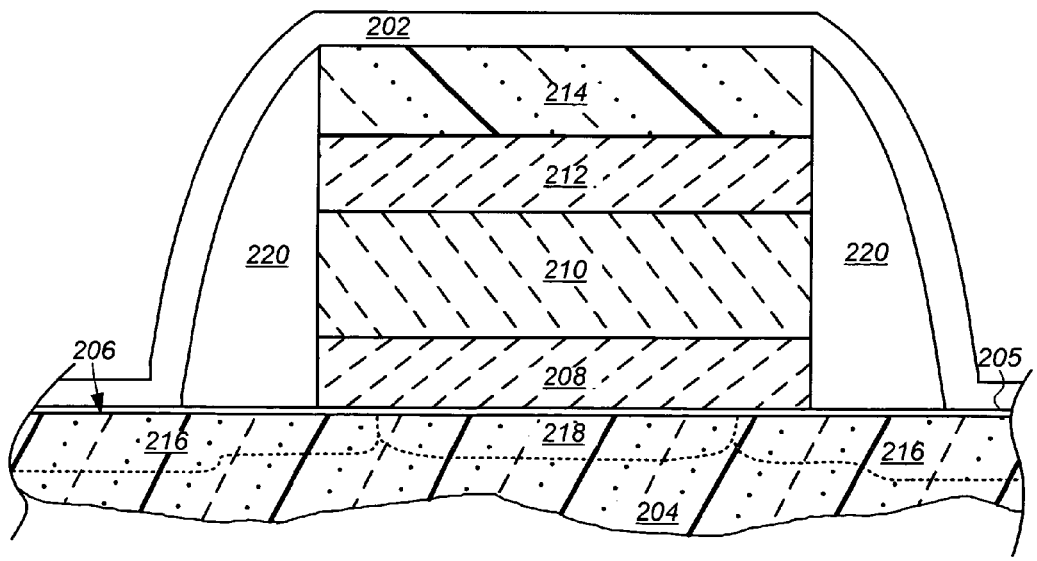
FIG. 2A is a partial cross-sectional side view of a memory transistor and a strain inducing layer according to an embodiment of the present invention.

In a first of these alternative embodiments, shown in FIG. 2A, the strain inducing structure comprises a strain inducing layer 202 overlying the completed transistor previously formed on a substrate 204. In the embodiment shown in FIG. 2A the transistor is a SONOS memory transistor comprising a SONOS gate stack formed over a thin pad/gate oxide 205 on a surface 206 of the substrate 202. The SONOS gate stack generally includes a lower oxide layer 208, a nitride or oxynitride charge storing or trapping layer 210, a top oxide layer 212, and a gate electrode 214, typically poly-silicon (poly), formed over the charge storing layer. The transistor further includes heavily doped source and drain (S/D) regions 216 aligned to the gate stack and separated by an undoped or lightly doped channel region or channel 218. Generally, one or more sidewall spacers 220 surround the gate stack to electrically insulate it from contacts (not shown) to the S/D regions 216 and from other transistors or devices in the IC formed on the substrate 204.

It will be appreciated that the strain inducing layer 202, which substantially covers the completed transistor, induces strain in the gate stack as well as in the underlying channel 218. As noted above, inducing strain in the channel 218 improves transistor performance by reducing the band gap and increasing carrier mobility. In addition, it has been found inducing strain in the SONOS gate stack will change energy levels of charge traps formed within the charge trapping layer 210 improving data retention characteristics of the memory transistor, as shown in the of FIG. 3.

Figure 3:
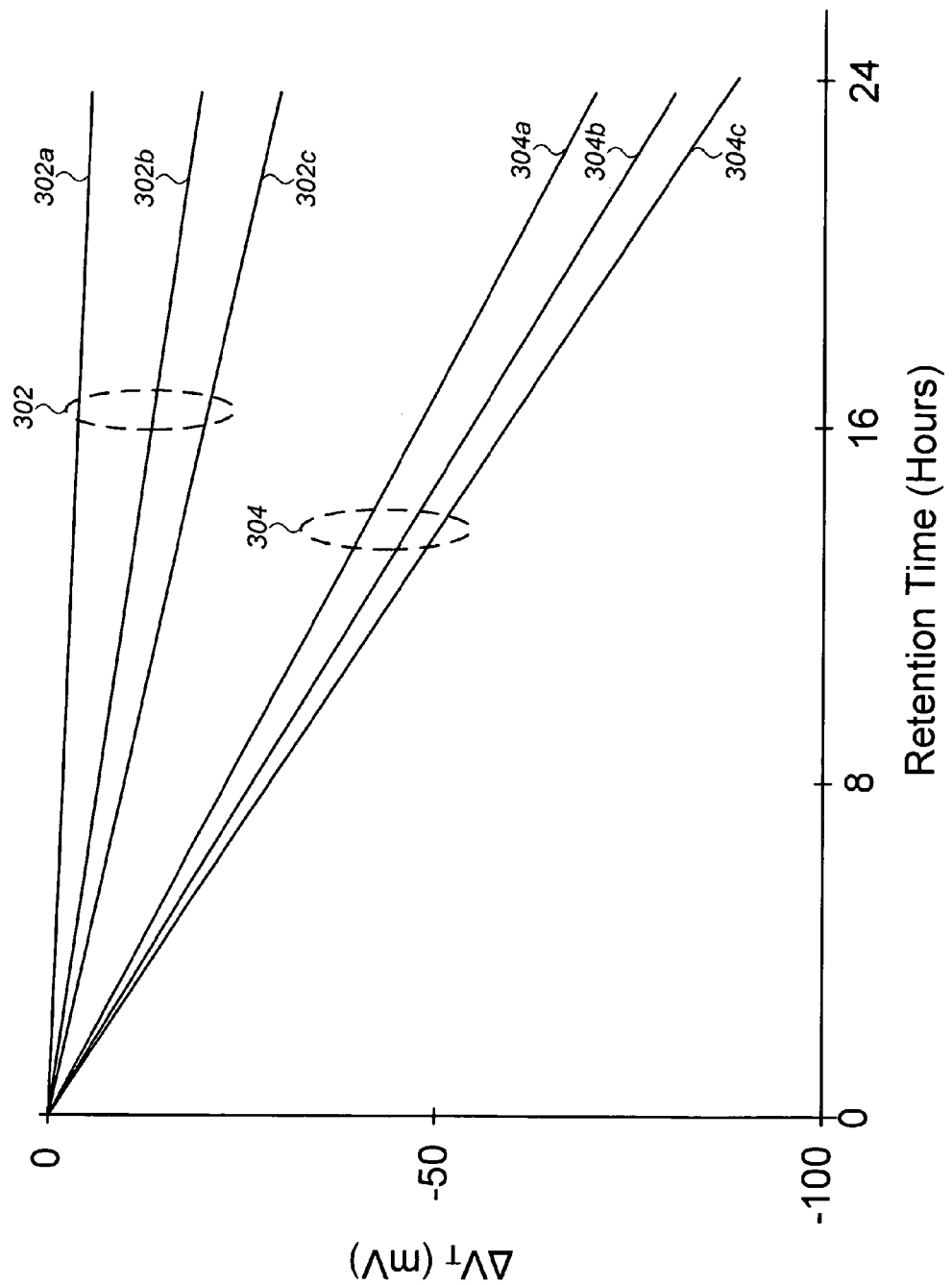
FIG. 3 is a graph showing an improvement in data retention for a SONOS memory transistor in which strain is induced in a gate stack as well as in an underlying channel as compared to a conventional memory cell.

FIG. 3 is a graph showing an improvement in data retention for a SONOS memory transistor in which strain is induced in a gate stack as well as in an underlying channel as compared to a conventional memory cell. The group of traces or lines labeled 302 illustrates non-volatile memory (NVM) cell data retention for NVM cells held at 190° C. for 24 hours and comprising memory transistors with an induced tensile strain of about 162 MPa according to the present invention. The group of traces or lines labeled 304 illustrates data retention for conventional NVM cells under the same conditions. In particular, the line labeled 302a illustrates data retention for a NVM cell transistor with an induced tensile strain having a width-to-length ratio (W/L) ratio of 0.16µ/0.26µ; the line labeled 302b illustrates data retention for a NVM cell having a W/L ratio of 0.16µ/0.24µ; and the line labeled 302c illustrates data retention for a NVM cell having a W/L ratio of 0.16µ/0.22µ. Similarly, the line labeled 304a illustrates data retention for a conventional NVM cell having a W/L ratio of 0.16µ/0.26µ; the line labeled 304b illustrates data retention for a NVM cell having a W/L ratio of 0.16µ/0.24µ; and the line labeled 304c illustrates data retention for a NVM cell having a W/L ratio of 0.16µ/0.22µ. Referring to FIG. 3, it is seen that after 24 hours a programmed threshold voltage (Vt) for the unstrained memory transistors of a conventional NVM (represented by the group of traces or lines labeled 304) cell has decreased by more than about 50 millivolts (mV). However, in the same time period the programmed Vt for the memory transistors comprising induced tensile strain of according to the present invention (represented by the group of traces or lines labeled 302) cell has decreased by less than about 25 mV, indicating at least an order of magnitude improvement in retention time.

The strain inducing layer 202 can include one or more layers of a suitable material including, for example, one or more layers of silicon-oxides, silicon-nitrides, and/or silicon-germanium, having thicknesses and deposited under conditions selected to induce a desired compressive or tensile strain in the channel 218 and/or the gate stack.

Preferably, the strain inducing layer 202 includes a silicon-nitride (nitride) layer deposited to a thickness of from about 100 angstroms (Å) to about 1000 Å, and more preferably from about 300 Å to about 500 Å. For example, in one embodiment the strain inducing layer 202 can include a Plasma Enhanced Chemical Vapor Deposition (PECVD) silicon-nitride ($Si_3N_4$) layer deposited by a PCEVD process using a silicon source, such as silane, chlorosilane, or dichlorosilane, and a nitrogen source, such as nitrogen ($N_2$) or ammonia ($NH_3$). Suitable PECVD tools include, for example, a Novellus PECVD tool, commercially available from Novellus Systems, Inc. of San Jose, Calif.

Alternatively, the strain inducing layer 202 can include a Bis-TertiaryButylAmino Silane (BTBAS) silicon-nitride layer ($Si_3N_4$) that is deposited using a BTBAS gas or precursor in a Low Pressure Chemical Vapor Deposition (LPCVD) or Atomic Layer Deposition (ALD) process to produce a longitudinal tensile strain and a vertically compressive strain in the channel region 218, both of which increase electron mobility in a NFET or N-type device.

Figure 2B:
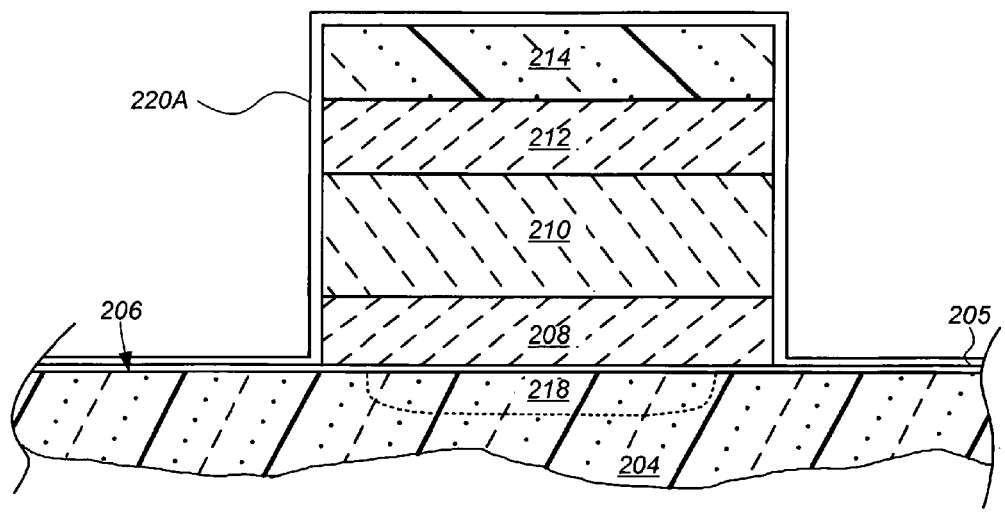
FIGS. 2B through 2D illustrate a process flow for forming a memory transistor a comprising composite spacers including a disposable material that is removed prior to forming the strain inducing layer according to an embodiment of the present invention.
Figure 2C:
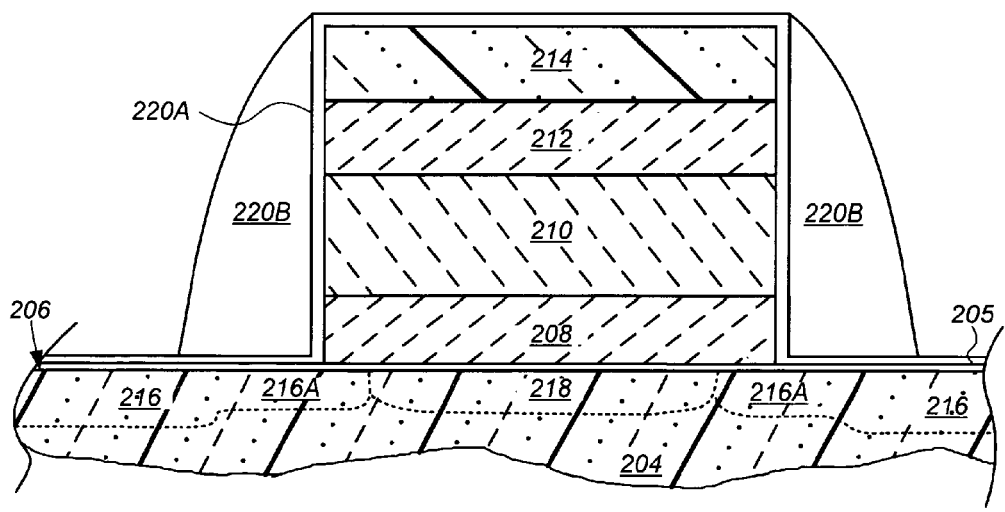
Figure 2D:
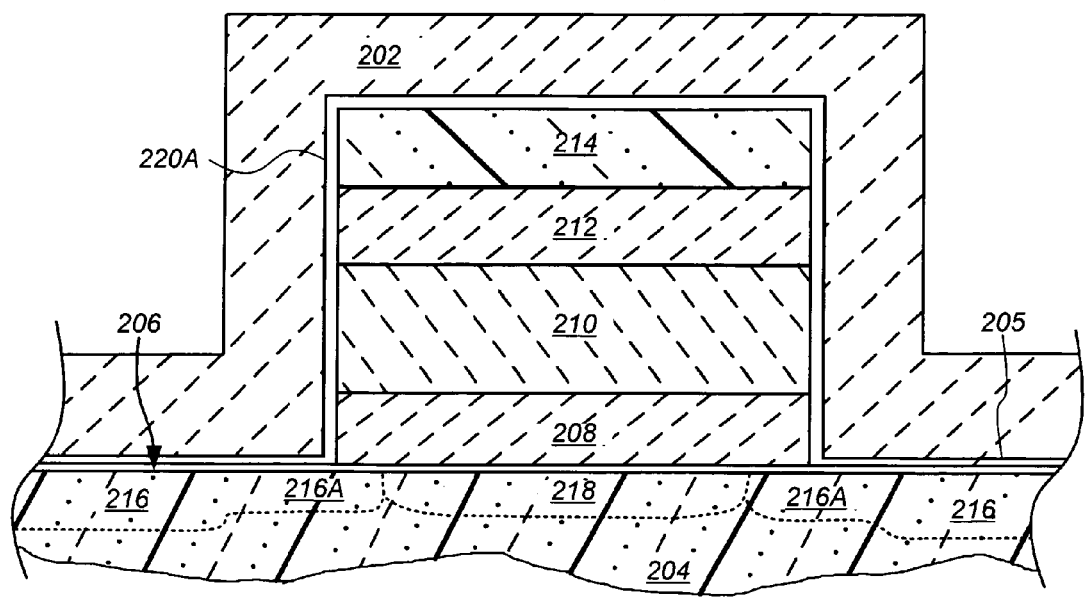

In another embodiment, illustrated in FIGS. 2B through 2D, the sidewall spacers for the memory transistor and/or the logic transistors can include composite spacers comprising a protective liner 220A and a sacrificial or disposable material 220B that is removed prior to forming the strain inducing layer 202. It will be appreciated that by eliminating the permanent sidewall spacers found in conventional transistors, the pitch or spacing between transistors or devices in the semiconductor memory or IC can be reduced. Moreover, eliminating the permanent spacers allows the strain inducing layer 202 to be located closer to the channel 218 and the SONOS gate stack, thereby enabling it to produce a more focused strain of from about to about 200 MPa to about 600 MPa, or from about 0.15 to about 0.30% directly in the channel and the gate stack. It has been found that this amount of strain is sufficient to yield from about a 5 to about a 20 percent increase in speed of the device.

A method of forming then removing the disposable material 220B of the composite spacers will now be described in greater detail with reference to FIGS. 2B through 2D. Referring to FIG. 2B, a protective liner 220A is formed over the gate stack and, preferably, over at least a portion of the surface 206 of the substrate 204 prior to implanting the S/D regions (not shown in this figure). The protective liner 220A serves to protect the gate stack and the adjacent surface 206 of the substrate 204 during subsequent forming and removal of the disposable spacers (not shown in this figure) and to electrically insulate it from contacts (not shown) to the S/D regions (not shown in this figure) and from other transistors or devices in the IC formed on the substrate 204. Generally, the protective liner 220A can include an oxide, such as silicon-oxide, or a nitride, such as silicon-nitride, and can be deposited by any suitable standard processing technique including, for example, Chemical Vapor Deposition (CVD), or PECVD. Preferably, the protective liner 220A extends over regions in which the source and drain of the device are to be formed.

Optionally, tip and halo implants may be performed through the protective liner 220A to form S/D extensions 216A (shown in FIG. 2C) extending partially into the channel 218 under the gate stack.

Referring to FIG. 2C, sacrificial spacers of a disposable material 220B are formed over the protective liner 220A and abutting sidewalls of the gate stack. The disposable material 220B can be formed by first depositing and then blanket etching a silicon-containing layer over the gate stack. The silicon-containing layer can include, for example, an amorphous-silicon or poly-silicon layer, or a silicon-germanium (SiGe) layer. The spacer or blanket etch may be accomplished in a number of different ways including, for example, low pressure etching at a moderate power (about 500 W) in a plasma of a chlorine containing gas, such as $Cl_2$, or $BCl_3$.

Next, still referring to FIG. 2C, the source and drain implants of the appropriate species and energy are implanted through the protective liner 220A and the disposable material 220B to form the S/D regions 216. Preferably, the substrate 204 is annealed to drive-in the source and drain implants creating the S/D regions 216 shown in FIG. 2C. More preferably, the anneal step, if not done immediately following the S/D implant, is at least performed prior to deposition of the strain inducing layer (described below) to avoid relaxing or reducing the strain induced by the strain inducing layer.

In FIG. 2D, the disposable material 220B is stripped or removed the strain inducing layer 202 deposited. In one embodiment, amorphous-silicon or poly-silicon disposable material 220B is removed in a dry etch step using Xenon difluoride ($XeF_2$), preceded by a hydrofluoric (HF) dip to remove any native oxide thereon, which would otherwise impede removal of the spacers by the $XeF_2$. A suitable $XeF_2$ etch process involves sublimating the $XeF_2$ is in a container or vessel to a pressure of about 4 mTorr (the vapor pressure of $XeF_2$), and then introduced into a separate etch chamber in which the substrate 204 is positioned. Preferably, the $XeF_2$ release or etching process is performed in vapor phase at a pressure of 60 mTorr, at room temperature and with no external energy sources. Under these conditions, a highly selective and isotropic etch of the silicon-containing layer has been observed with rates as high as 10 microns per minute. The $XeF_2$ release process is allowed to proceed without etching any of the underlying protective liner 220A.

In an alternative embodiment, the disposable material 220B is removed in a wet etch step. For example, disposable material 220B including an amorphous or poly-silicon silicon-containing layer can be stripped or removed in a single wafer wet processing toot, commercially available from SEZ Group, of Villach, Austria, or in a wet processing bath or sink using a mixed nitric acid ($HNO_3$) and HF wet chemistry. Disposable material 220B including a SiGe silicon-containing layer can be removed in a wet chemistry containing heated hydrogen peroxide ($H_2O_2$).

Still referring to FIG. 2D, the strain inducing layer 202 is deposited directly over the gate stack and at least a portion of the surface 206 of the substrate 204 adjacent thereto to induce strain in the channel 218 underlying the gate stack. As described above, the strain inducing layer 202 can include one or more layers of suitable material having thicknesses and deposited under conditions selected to induce a desired compressive or tensile strain in the channel 218 and/or the gate stack. Preferably, the strain inducing layer 202 includes a compressive or tensile PECVD or BTBAS silicon-nitride layer.

Figure 2E:
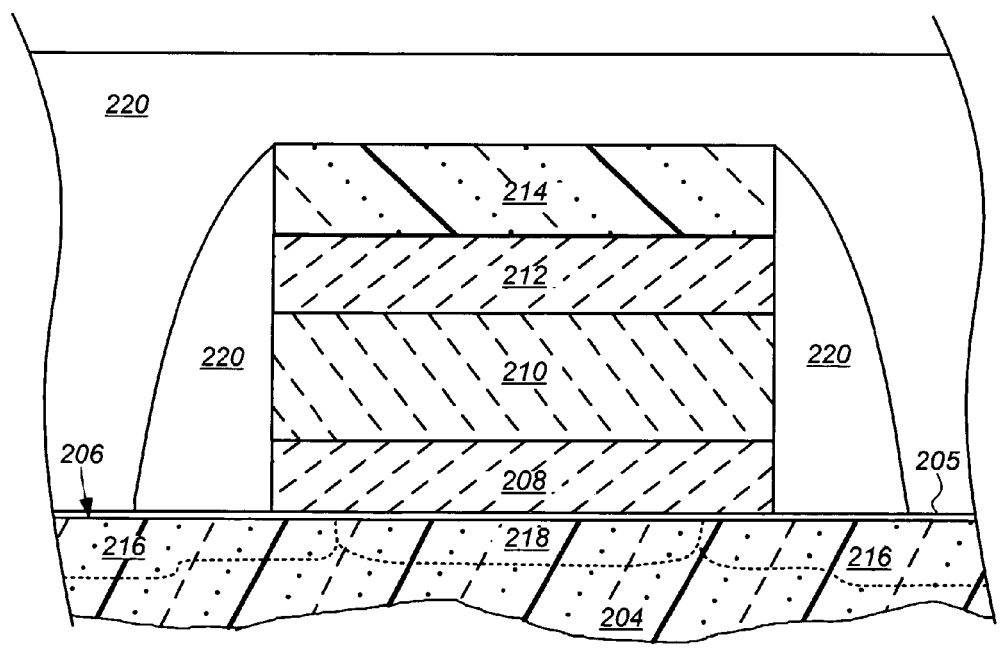
FIG. 2E is a partial cross-sectional side view of a memory transistor and a strain inducing pre-metal dielectric (PMD) layer according to an embodiment of the present invention.

In another embodiment, illustrated in FIG. 2E the strain inducing structure comprises a strain inducing pre-metal dielectric (PMD) layer 220 overlying the completed transistor previously formed on a substrate 204. As with the embodiments described above, the strain inducing PMD layer 220 can include one or more layers of a suitable dielectric material having thicknesses and deposited under conditions selected to induce a desired compressive or tensile strain in the channel 218 and/or the gate stack. Suitable dielectric materials include, for example, silicon-oxides and silicon-nitrides.

In one preferred embodiment, the strain inducing PMD layer 220 can include one or more layers of a tensile HARP™ oxide deposited in a HARP™ oxidation process using a LPCVD tool, ozone and/or TEOS based process gas or precursors. More preferably, the strain inducing PMD layer 220 has an overall or combined thickness of from about 500 Å to about 2000 Å. Generally, the surface of the PMD layer 220 is planararized using, for example, a CMP process prior to the formation of contacts (not shown) to the gate electrode 214 and S/D regions 216 of the transistor and the subsequent deposition of a local interconnect (LI) metal layer (not shown).

It will be appreciated that although the strain inducing structures of the present invention are shown in FIGS. 2A through 2E and described above as being used with SONOS memory transistors, the method and structures of the invention are not so limited and can be used with other types of FET memory or logic transistors. It is noted that a significant advantage of the present invention is that the processing method and strain inducing structures can be used to fabricate ICs including both memory and logic transistors on a single substrate, thereby improving the performance of both types of transistors. The method and structure of the present invention are particularly useful fabricating ICs including embedded memory such as System-On-Chip (SOC) ICs.

It will further be appreciated that one or more of the above described methods and structures can be combined to increase or tailor the strain induced in the channel and/or gate stack of the transistors. For example, the strain inducing STI structure 100 of FIG. 1 can be combined with any of the strain inducing structures described with respect to FIGS. 2A through 2E to increase or reduce the strain induced in the transistor channel. In addition, it will be understood that the strain inducing PMD layer 220 of FIG. 2E may be combined with the composite spacers and disposable material 220B of FIGS. 2B through 2D to decrease the pitch or spacing between transistors and focus the strain more directly in the channel and/or gate stack.

The foregoing description of specific embodiments and examples of the invention have been presented for the purpose of illustration and description, and although the invention has been described and illustrated by certain of the preceding examples, it is not to be construed as being limited thereby. They are not intended to be exhaustive or to limit the invention to the precise forms disclosed, and many modifications, improvements and variations within the scope of the invention are possible in light of the above teaching. It is intended that the scope of the invention encompass the generic area as herein disclosed, and by the claims appended hereto and their equivalents. The scope of the present invention is defined by the claims, which includes known equivalents and unforeseeable equivalents at the time of filing of this application.

What is claimed is:

1. A method of forming a semiconductor memory including a non-volatile memory transistor, the method comprising steps of:

forming a gate for a non-volatile memory transistor on a surface of a substrate overlaying a channel region formed therein, the gate including a charge trapping layer; and forming a strain inducing structure over the gate of the non-volatile memory transistor to change energy levels of charge traps formed in the charge trapping layer to increase charge retention of the charge trapping layer.

2. A method according to claim 1, wherein the step of forming a strain inducing structure comprises the step of forming the strain inducing structure over at least a portion of the surface of the substrate surrounding the channel region to induce strain in the channel region underlying the gate.

3. A method according to claim 2, further comprising the step of forming a logic transistor including a gate overlying a channel region in the substrate prior to forming the strain inducing structure, and wherein the step of forming a strain inducing structure comprises the step of forming the strain inducing structure over at least a portion of the surface of the substrate surrounding the channel region to induce strain in the channel region of the logic transistor.

4. A method according to claim 1, wherein the strain inducing structure comprises pre-metal dielectric (PMD) layer formed using a High Aspect Ratio Process (HARP™) oxidation process.

5. A method according to claim 1, wherein the non-volatile memory transistor is a silicon-oxide-nitride-oxide-silicon (SONOS) transistor comprising a SONOS gate stack.

6. A method according to claim 5, wherein the strain inducing structure comprises a compressive nitride layer formed using a plasma enhanced chemical vapor deposition (PECVD) process.

7. A method according to claim 5, wherein the strain inducing structure comprises a tensile nitride layer formed using a plasma enhanced chemical vapor deposition (PECVD) process.

8. A method according to claim 5, wherein the strain inducing structure comprises a Bis-TertiaryButylAmino Silane (BTBAS) nitride layer that is deposited using a BTBAS gas.

9. A method according to claim 5, further comprising steps of prior to forming the strain inducing structure:

forming spacers on sidewalls of the gate for the non-volatile memory transistor, each of the spacers comprising a first liner having a stepped portion and a disposable spacer material over the stepped portion;

forming a source and drain regions by performing ion implantation through a portion of the first liner; and removing the disposable spacer material after forming the source and drain regions.

10. A method comprising:

forming a gate for a silicon-oxide-nitride-oxide-silicon (SONOS) memory transistor on a surface of a substrate overlaying a channel region formed therein, the gate including an insulating charge trapping layer; and forming a strain inducing structure over the gate of the SONOS memory transistor to change energy levels of charge traps formed in the charge trapping layer.

11. A method according to claim 10, wherein the insulating charge trapping layer comprises nitride.

12. A method according to claim 10, wherein forming a strain inducing structure comprises forming the strain inducing structure over at least a portion of the surface of the substrate surrounding the channel region to induce strain in the channel region underlying the gate.

13. A method according to claim 12, further comprising forming a logic transistor including a gate overlying a channel region in the substrate prior to forming the strain inducing structure, and wherein forming a strain inducing structure comprises the step of forming the strain inducing structure over at least a portion of the surface of the substrate surrounding the channel region of the logic transistor to induce strain therein.

14. A method according to claim 10, wherein the strain inducing structure comprises pre-metal dielectric (PMD) layer formed using a High Aspect Ratio Process (HARP™) oxidation process.

15. A method according to claim 10, wherein the strain inducing structure comprises a nitride layer formed using a plasma enhanced chemical vapor deposition (PECVD) process.

16. A method according to claim 10, wherein the strain inducing structure comprises a Bis-TertiaryButylAmino Silane (BTBAS) nitride layer that is deposited using a BTBAS gas.

17. A method according to claim 10, further comprising steps of prior to forming the strain inducing structure:

forming spacers on sidewalls of the gate for the non-volatile memory transistor, each of the spacers comprising a first liner having a stepped portion and a disposable spacer material over the stepped portion;

forming a source and drain regions by performing ion implantation through a portion of the first liner; and removing the disposable spacer material after forming the source and drain regions.

18. A semiconductor device comprising:

a transistor on a surface of a substrate, the transistor including a silicon-oxide-nitride-oxide-silicon (SONOS) gate stack overlaying a channel region formed in the substrate, the SONOS gate stack including a charge trapping layer comprising nitride; and a strain inducing structure formed over the SONOS gate stack adapted to increase energy levels of charge traps formed in the charge trapping layer to increase charge retention of the charge trapping layer.

19. A semiconductor memory according to claim 18, wherein the strain inducing structure comprises a Bis-TertiaryButylAmino Silane (BTBAS) nitride layer.

20. A semiconductor memory according to claim 18, wherein the transistor does not comprise sidewall spacers on the SONOS gate stack and the strain inducing structure abuts the SONOS gate stack.

* * * * *